(12) United States Patent
Yoo et al.

(10) Patent No.: US 7,977,250 B2
(45) Date of Patent: Jul. 12, 2011

(54) STRIPPER SOLUTION AND METHOD OF MANUFACTURING LIQUID CRYSTAL DISPLAY USING THE SAME

(75) Inventors: Soon Sung Yoo, Gyeonggi-do (KR); Oh Nam Kwon, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/837,313

(22) Filed: Jul. 15, 2010

(65) Prior Publication Data

US 2011/0000876 A1    Jan. 6, 2011

Related U.S. Application Data

(62) Division of application No. 11/117,306, filed on Apr. 29, 2005, now Pat. No. 7,776,668.

(30) Foreign Application Priority Data

Apr. 29, 2004 (KR) .................................. 2004-30206

(51) Int. Cl.
*H01L 21/302* (2006.01)
*H01L 21/461* (2006.01)

(52) U.S. Cl. . 438/738; 438/149; 438/745; 257/E21.309; 257/E21.414

(58) Field of Classification Search .............. 438/30, 438/733, 738, 745, 149, 151; 257/E21.221, 257/E21.254, E21.235, E21.309, E21.414
See application file for complete search history.

(56) References Cited

U.S. PATENT DOCUMENTS

| | | | |
|---|---|---|---|
| 4,992,108 A | 2/1991 | Ward et al. | 134/38 |
| 5,605,845 A | 2/1997 | Young | 438/157 |
| 6,080,606 A | 6/2000 | Gleskova et al. | 438/151 |
| 6,211,127 B1 | 4/2001 | Kim et al. | 510/176 |
| 6,541,790 B1 | 4/2003 | Pichler | 257/40 |
| 6,558,879 B1 | 5/2003 | Peters et al. | 430/331 |
| 6,894,311 B2 | 5/2005 | Maeda et al. | 257/66 |
| 6,972,516 B2 | 12/2005 | Stecki et al. | 313/498 |
| 7,118,947 B2 | 10/2006 | Yoo et al. | 438/151 |
| 7,488,632 B2 | 2/2009 | Ahn et al. | 438/159 |
| 2001/0014534 A1 | 8/2001 | Aoki et al. | 438/689 |
| 2002/0135722 A1 | 9/2002 | Lee | 349/123 |
| 2002/0140877 A1 | 10/2002 | Chen | 349/38 |
| 2004/0195571 A1 | 10/2004 | Ahn et al. | 257/72 |
| 2004/0197966 A1 | 10/2004 | Cho et al. | 438/151 |
| 2004/0198621 A1 | 10/2004 | Lee et al. | 510/175 |
| 2004/0241931 A1 | 12/2004 | Akimoto et al. | 438/220 |
| 2005/0077523 A1 | 4/2005 | Ahn et al. | 257/72 |
| 2005/0078254 A1 | 4/2005 | Lim et al. | 349/139 |

(Continued)

*Primary Examiner* — Matthew C Landau
*Assistant Examiner* — Latanya Crawford
(74) *Attorney, Agent, or Firm* — Morgan, Lewis & Bockius LLP

(57) ABSTRACT

A method for manufacturing a liquid crystal display includes simultaneously forming a gate electrode and a gate bus line on a transparent dielectric substrate, simultaneously forming a channel layer, an ohmic contact layer, and source/drain electrodes by forming a gate insulation film, an amorphous silicon film, a doped amorphous silicon film, and a metal film on the transparent dielectric substrate on which the gate electrode and the gate bus line are formed and etching the metal film, the amorphous silicon film, and the doped amorphous silicon film, and forming a pixel electrode by forming a protective film and a transparent metal film on the transparent dielectric substrate upon which the source/drain electrodes are formed and finely etching the transparent metal film through a lift-off process using a stripper solution.

2 Claims, 5 Drawing Sheets

U.S. PATENT DOCUMENTS

| | | | |
|---|---|---|---|
| 2005/0092995 A1 | 5/2005 | Yoo et al. | 257/72 |
| 2006/0046361 A1 | 3/2006 | Song et al. | 438/151 |
| 2006/0046365 A1* | 3/2006 | Park et al. | 438/197 |
| 2006/0099731 A1 | 5/2006 | Buckley et al. | 438/99 |
| 2006/0138078 A1 | 6/2006 | Koizumi | 216/13 |
| 2006/0180815 A1 | 8/2006 | Sarma et al. | 257/66 |

* cited by examiner

US 7,977,250 B2

STRIPPER SOLUTION AND METHOD OF MANUFACTURING LIQUID CRYSTAL DISPLAY USING THE SAME

The present patent application is a divisional patent application derived from the patent application Ser. No. 11/117,306 filed on Apr. 29, 2005 now U.S. Pat. No. 7,776,668, which claims the benefit of Korean Patent Application No. 30206/2004 filed in Korea on Apr. 29, 2004, which is hereby incorporated by reference.

BACKGROUND OF THE INVENTION

1. Field of the Invention

The present invention relates to a liquid crystal display (LCD), and more particularly, to a stripper solution to prevent yield degradation due to particles produced during the LCD manufacturing process and a method for manufacturing a LCD using the same.

2. Discussion of the Related Art

With the rapid change in the information society, one of the information display device, a LCD module, gained its popularity because of the greater advantages, for example, miniaturization, lightweight, flatness, and low power consumption, as compared to a cathode ray tube (CRT). The CRT has advantages in its performance and price, however, size and portability of the CRT are not matched up with the LCD. While the LCD is actively replacing the CRT with its advantages, however, LCD is more expensive than the CRT.

The LCD includes an array substrate on which a thin film transistor (TFT) is arranged, and includes a color filter substrate on which R/G/B color filter layers are formed. The array substrate and the color filter substrate are pressed together with a liquid crystal layer interposed therebetween. The array substrate and the color filter substrate are manufactured through several mask processes. Specifically, the array substrate is manufactured through a 5-mask process.

A first mask process includes forming a gate bus line and a gate electrode on a transparent glass substrate by depositing a metal film on the transparent glass substrate, thereafter etching the deposited metal film. Subsequently, a second mask process includes forming a channel layer on the substrate by forming a gate insulating film, an amorphous silicon film, and a doped amorphous silicon film. Next, a third mask process includes forming source/drain electrodes and a data bus line by depositing source/drain metal films on the substrate having the channel layer formed thereon and then etching the deposited source/drain metal films. Then, a fourth mask process includes forming a protective film for device protection and then forming a contact hole. Finally, a fifth mask process includes forming a pixel electrode by depositing an indium tin oxide (ITO) transparent metal film on the substrate having the protective film formed thereon and then etching deposited ITO transparent metal film.

However, an increase in the total number of mask processes increases the LCD unit price. Accordingly, research for reducing the total number of mask processes has been conducted. As a result, a 4-mask process where the channel layer and the source/drain electrodes are simultaneous formed has been developed.

FIG. 1 is a plan view illustrating a pixel structure of a related art LCD. Referring to FIG. 1, a gate bus line 1 for applying a driving signal and a data bus line 3 for applying a data signal are vertically intersecting each other, whereby a unit pixel area is defined. A pixel electrode 9 is disposed in the unit pixel area. A TFT, acting as, a switching device is disposed on a region where the gate bus line 1 and the data bus line 3 intersect each other vertically. The TFT includes a gate electrode 5 electrically connected to the gate bus line 1, a channel layer formed on the gate electrode 5, and source/drain electrodes 7a and 7b. When the TFT is turned ON, a data signal from the data line 3 is applied through the source electrode 7a and the drain electrode 7b to the pixel electrode 9.

The data signal applied to the pixel electrode 9 forms an electric field in association with a common electrode, which rotates liquid crystal molecules in a liquid crystal layer to adjust the transmissivity of light passing through the liquid crystal layer. The adjusted light passes through the color filter layers of the color filter substrate, such that an image of various colors is displayed.

FIGS. 2A to 2D are cross-sectional views along line I-I' of FIG. 1, illustrating a related art LCD manufacturing process of FIG. 1.

Referring to FIG. 2A, a metal film of Al or Cr is deposited on a transparent dielectric substrate 10 through a sputtering method. Accordingly, the gate bus line 1 and the gate electrode 5 are formed through a first mask process.

Referring to FIG. 2B, a gate insulating film 2 is formed on the dielectric substrate 10 and the gate electrode 5, thereafter an amorphous silicon film and an n+ amorphous silicon film are formed. Then, a metal film is deposited on the dielectric substrate 10 on which the n+ amorphous silicon film has been formed. Thereafter, the source/drain electrodes 7a and 7b, an ohmic contact layer 6, and a channel layer 4 are simultaneous formed through a second mask process by patterning a halftone photoresist film, and successively etching the metal film, the amorphous silicon film, and the n+ amorphous silicon film. The halftone photoresist film is patterned by using a diffractive exposure mask.

Referring to FIG. 2C, a protective film 11 is formed on a surface of the dielectric substrate 10 on which the source/drain electrodes 7a and 7b have been formed. Then, a contact hole is formed exposing the drain electrode 7B through a second mask process.

Referring to FIG. 2D, a transparent ITO metal film is deposited on the dielectric substrate 10 on which the contact hole has been formed. Then, the pixel electrode 9 is formed through a fourth mask process to complete the LCD manufacturing process. However, when compared with a 3-mask process that is being developed, the 4-mask process increases the LCD manufacturing cost because of the increased total number of individual mask processes.

SUMMARY OF THE INVENTION

Accordingly, the present invention is directed to a stripper solution and a method for manufacturing a LCD using the same that substantially obviate one or more of the problems due to limitations and disadvantages of the related art.

An object of the present invention is to provide a stripper solution to prevent yield degradation due to particles produced during the LCD manufacturing process and a method for manufacturing a LCD using the same.

Additional features and advantages of the invention will be set forth in the description which follows, and in part will become apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a liquid crystal display includes simultaneously forming a gate electrode and a gate bus line on a transparent dielectric substrate, simultaneously forming a channel layer, an ohmic contact layer, and source/drain electrodes by forming a gate insulation film, an amorphous silicon film, a doped amorphous silicon film, and a metal film on the transparent dielectric substrate on which the gate electrode and the gate bus line are formed and etching the metal film, the amorphous silicon film, and the doped amorphous silicon film, and forming a pixel electrode by forming a protective film and a transparent metal film on the transparent dielectric substrate upon which the source/drain electrodes are formed and finely etching the transparent metal film through a lift-off process using a stripper solution.

In another aspect, a method of etching a transparent metal film includes subjecting the transparent conducting film to a stripper solution, and subjecting a photoresist film disposed beneath the transparent metal film to the stripper solution, wherein the stripper solution finely etches a surface of the transparent metal film and removes the photoresist film.

In another aspect, a method for manufacturing a liquid crystal display includes forming a gate electrode and a gate bus line on a transparent dielectric substrate, forming a gate insulation film, an amorphous silicon film, a doped amorphous silicon film, and a metal film on the transparent dielectric substrate, and etching the metal film, the amorphous silicon film, and the doped amorphous silicon film, forming a protective film on the transparent dielectric substrate, forming a photoresist film on the protective film, patterning the photoresist film, etching the protective film using the patterned photoresist film, forming a transparent metal film on the transparent dielectric substrate, the transparent metal film including a first portion disposed on the patterned photoresist film and a second portion disposed on the transparent dielectric substrate, and removing the photoresist film and the first portion of the transparent metal film using a lift-off process including a stripper solution, wherein the stripper solution finely etches particles of the transparent metal film produced during the lift-off process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
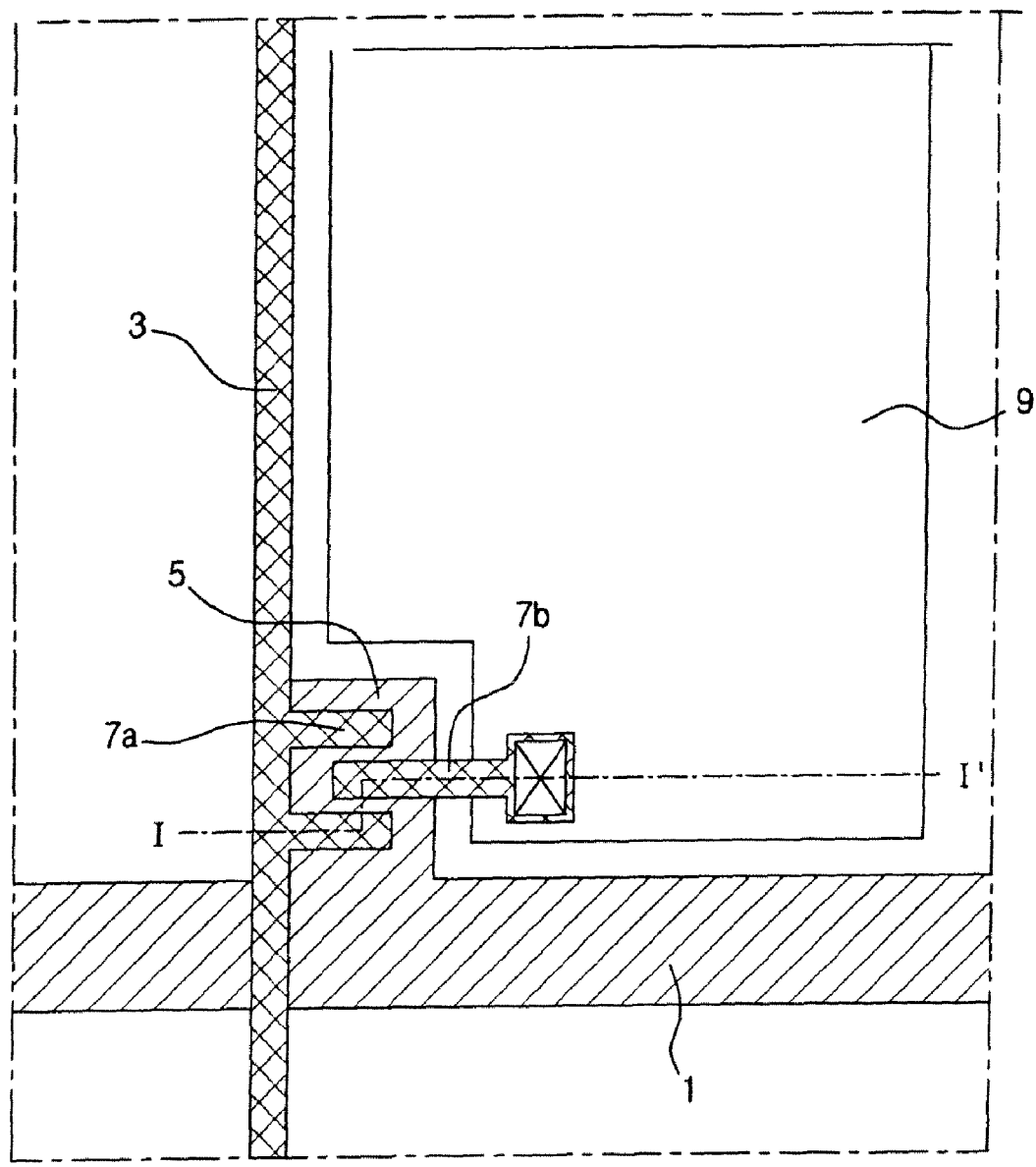
FIG. 1 is a plan view illustrating a pixel structure of a related art LCD.
Figure 2A:
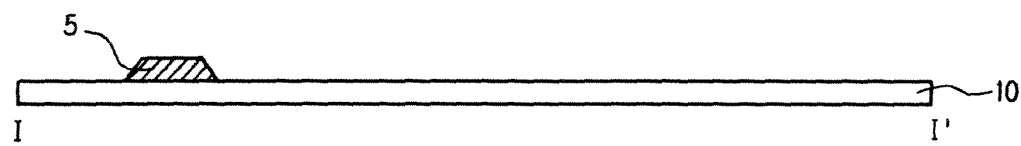
FIGS. 2A to 2D are cross-sectional views along IT of FIG. 1, illustrating a LCD manufacturing process of FIG. 1.
Figure 2B:
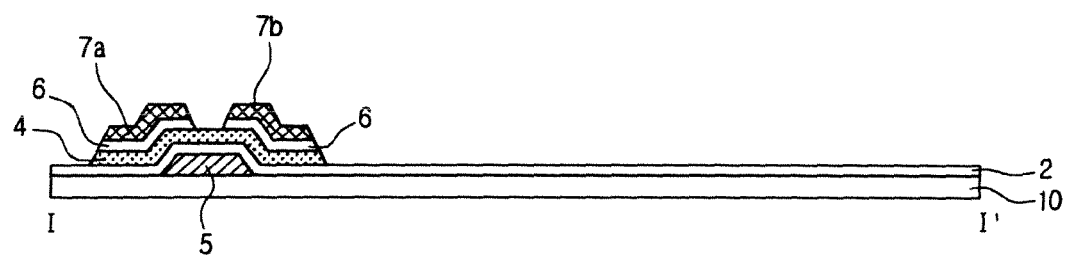
Figure 2C:
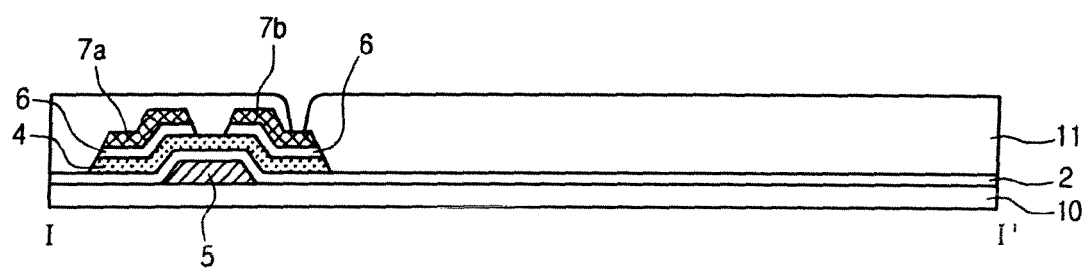
Figure 2D:
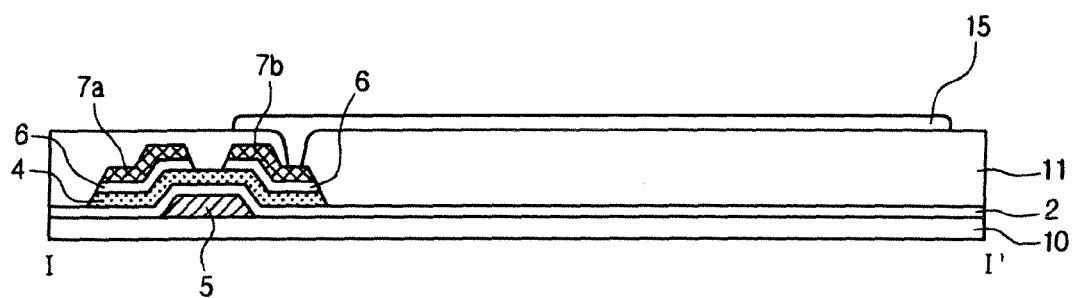
Figure 3A:
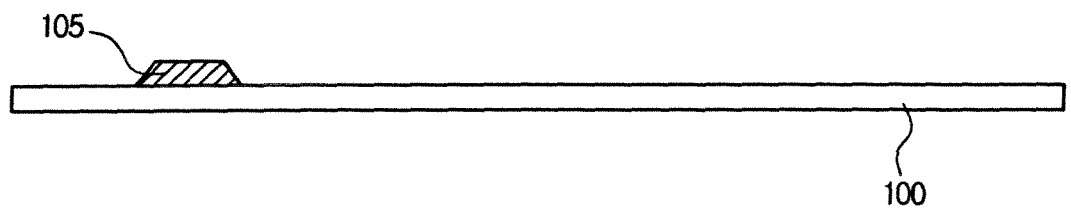
FIGS. 3A to 3E are cross-sectional views illustrating an exemplary process for manufacturing an LCD according to the present invention.

FIGS. 3A to 3E are cross-sectional views illustrating an exemplary process for manufacturing an LCD according to the present invention. Referring to FIG. 3A, a metal film is deposited on a transparent dielectric substrate 100 through a sputtering method. Then, a gate bus line and a gate electrode 105 are formed by etching the metal film through a first mask process.

Figure 3B:
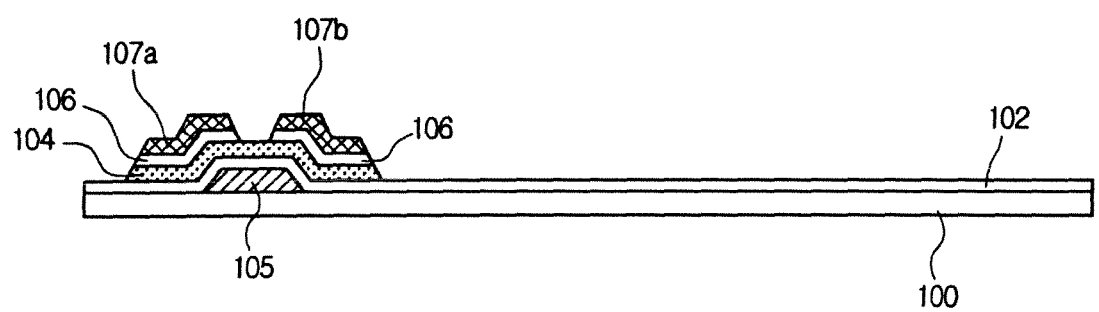

Referring to FIG. 3B, a gate insulating film 102 is formed on the dielectric substrate 100 on which the gate electrode 105 has been formed, and then an amorphous silicon film and an n+ amorphous silicon film are formed. A metal film is deposited on the dielectric substrate 100 on which the n+ amorphous silicon film has been formed. Then, source/drain electrodes 107a and 107b, an ohmic contact layer 106, and a channel layer 104 are simultaneously formed by etching the metal film, the amorphous silicon film, and the n+ amorphous silicon film using a halftone patterned photoresist film. The halftone photoresist film is patterned through a diffractive exposure process by a second mask process.

Figure 3C:
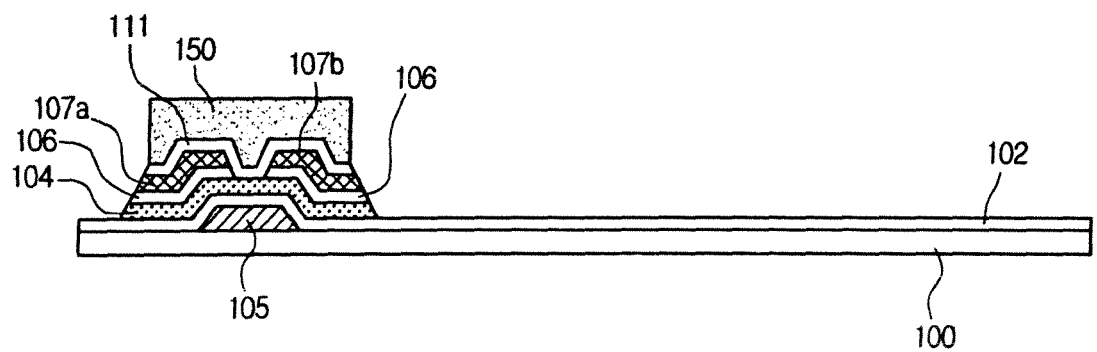

Referring to FIG. 3C, a protective film 111 is formed on a surface of the dielectric substrate 100 on which the source/drain electrodes 107a and 107b have been formed. Then, the protective film 111 is etched by patterning a photoresist film 150. At this time, the protective film 111 formed in the pixel area is completely removed and thus the dielectric substrate 100 is exposed to the outside.

Figure 3D:
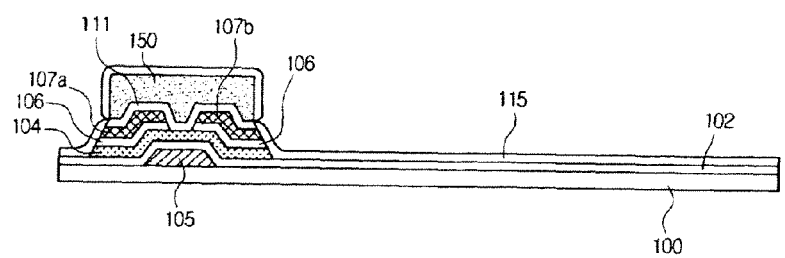

Referring to FIG. 3D, a transparent metal film 115 of ITO metal or indium zinc oxide (IZO) metal is deposited on the whole area of the dielectric substrate 100 on which the photoresist film 150 is patterned. Since the patterned photoresist film 150 exists on a region where the gate electrode 105 and the source/drain electrodes 107a and 107b are formed, the transparent metal film 115 is deposited on the patterned photoresist film 150 and the dielectric substrate 100. After the transparent metal film 115 is deposited, the patterned photoresist film 150 is removed through a lift-off process.

When the transparent metal film 115 formed on the patterned photoresist film 150 is removed through the lift-off process, ITO or IZO transparent metal breaks into particles in the stripper solution. Since the stripper solution is repeatedly used in the LCD manufacturing process, the amount of particles in the stripper solution gradually increases. Accordingly, the accumulation of the ITO or IZO transparent metal particles causes errors.

Accordingly, in the present invention, thiobenzoic acid or sulfonic acid (i.e., a carboxyl group) of 2 wt % is included in the stripper solution. Thus, the transparent metal particles can be removed from the stripper solution, such that particles of transparent metal film 115 and the patterned photoresist film 150 are simultaneously removed with a stripper solution through a fine etching process. In addition, the accumulation of the particles in the stripper solution is prevented by etching the particles finely. Thus, the stripper solution having low particle content can be used during repetitive lift-off processes, thereby increases yield of the LCD.

The content of the thiobenzoic acid or the sulfonic acid in the stripper solution is not limited to 2 wt %, but may be adjusted within a range that enables a fine etching of the transparent particles without affecting the pixel electrode formed through the lift-off process during the 3-mask process. In addition, the stripper solution may be formed of an MEA, BDG or NMP base.

In the exemplary embodiment of the present invention, the transparent metal particles are removed from the stripper solution through a fine etching process after 1-2 hours of the lift-off process. Thus, since the lift-off process completes within a relatively short time, the pixel electrode is not damaged by the stripper solution during the lift-off process.

The transparent metal particles and the patterned photoresist film 150 are removed together through a lift-off process using the stripper solution containing thiobenzoic acid or sulfonic acid. The transparent particles that are removed are gradually etched, in addition to being removed from the stripper solution. Accordingly, the particle density in the stripper solution is gradually reduced. The transparent metal film 115 formed through the process of FIG. 3D is electrically connected to one side portion of the drain electrode 107b.

Figure 3E:
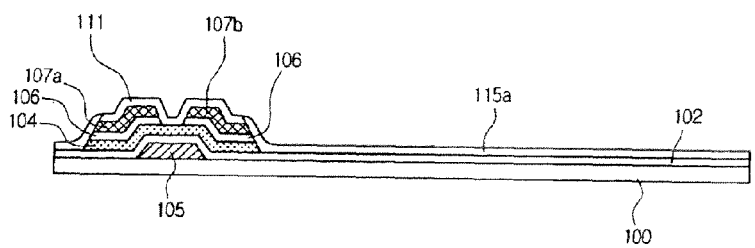

FIG. 3E illustrates a process in which the photoresist film is removed and a pixel electrode 115a is formed. As shown in FIG. 3E, the pixel electrode 115a is electrically connected to the drain electrode 107b when manufactured through the lift-off process. In addition, the gate electrode 105 and the pixel electrode 115a are formed on the same plane upon an upper surface of the dielectric substrate 100. The fine etching process using the stripper solution of the exemplary embodiment is performed while the protective film 111 and the pixel electrode 115a are simultaneously formed through the lift-off process during the third mask process. Accordingly, errors due to the accumulated particles in the stripper solution during the LCD manufacturing process are minimized.

Figure 4:
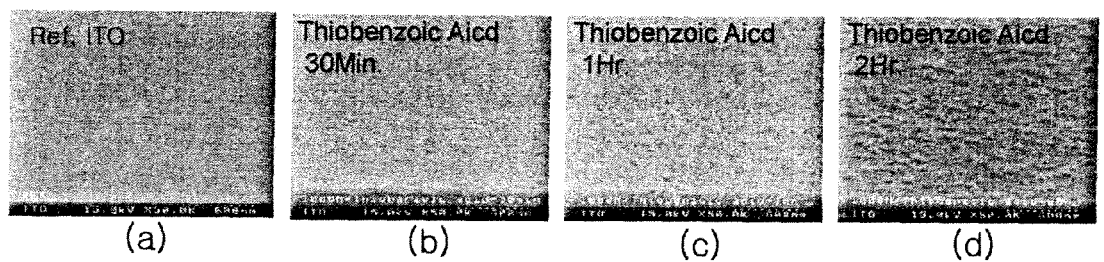
FIGS. 4A to 4D illustrate an exemplary state where an ITO metal film is finely etched with a stripper solution according to the present invention.

FIGS. 4A-4D illustrate an exemplary state where an ITO metal film (i.e., the transparent metal film 115) is finely etched using the stripper solution of the exemplary embodiment, in which the stripper solution includes thiobenzoic acid by about 2 wt %. In detail, FIG. 4A illustrates a state where the ITO metal film is divided through the lift-off process, FIG. 4B illustrates a state after 30 minutes from the state shown in FIG. 4A, FIG. 4C illustrates a state after one hour from the state in FIG. 4A, and, FIG. 4D illustrates a state after two hours from the state in FIG. 4A. States similar to those in FIGS. 4A through 4D can be found in the case of the IZO metal film.

Referring to FIG. 4B, the ITO metal film starts to etch in the stripper solution after 30 minutes. The surface of the ITP metal film shows fine surface after two hours of etching. Unlike a wet etchant, the tripper solution (or solvent) of the exemplary embodiment gradually etches the ITO metal film. In addition, the stripper solution of the exemplary embodiment, which includes thiobenzoic acid or sulfonic acid, can remove the ITO or IZO particles therefrom while removing the photoresist film during the lift-off process. Accordingly, the stripper solution of the exemplary embodiment removes only the photoresist film during the lift-off process, and finely etches and removes the transparent metal particles in a repeatedly-used stripper solution.

In FIGS. 4A-4D, the stripper solution, which is added with the thiobenzoic acid by about 2 wt %, is used to finely etch the ITO metal film (i.e., transparent metal film). The content of the added thiobenzoic acid may be adjusted within a range that does not damage the pixel electrode formed on the substrate during the lift-off process. Accordingly, the thiobenzoic acid may be substituted by the sulfonic acid.

As described above, the exemplary embodiment of the present invention finely etches and removes ITO or IZO particles that accumulate in the stripper solution during repeated lift-off processes, thereby preventing the LCD yield degradation due to the particles.

It will be apparent to those skilled in the art that various modifications and variations can be made in the stripper solution and method for manufacturing liquid crystal display using the same of the present invention without departing from the spirit or scope of the invention. Thus, it is intended that the present invention covers the modifications and variations of this invention provided they come within the scope of the appended claims and their equivalents.

What is claimed is:

1. A method of etching a transparent metal film, the method comprising:

subjecting the transparent conducting film to a stripper solution; and subjecting a photoresist film disposed beneath the transparent metal film to the stripper solution, wherein the stripper solution finely etches a surface of the transparent metal film and removes the photoresist film, wherein the stripper solution includes a thiobenzoic acid material.

2. The method according to claim 1, wherein an amount of the thiobenzoic acid material is about 2 wt %.

* * * * *